United States Patent [19]

Briefer

[11] 4,386,312
[45] May 31, 1983

[54] LINEAR CAPACITIVE SENSOR SYSTEM

[75] Inventor: Dennis K. Briefer, Berlin, Mass.

[73] Assignee: Setra Systems, Inc., Acton, Mass.

[21] Appl. No.: 256,994

[22] Filed: Apr. 24, 1981

[51] Int. Cl.³ .................... G01R 11/52; G01R 27/26
[52] U.S. Cl. ............................... 324/60 C; 324/61 R; 73/718
[58] Field of Search ............... 324/60 C, 60 R, 61 R, 324/162; 73/718; 361/283, 290, 291

[56] References Cited

U.S. PATENT DOCUMENTS

| | | | |
|---|---|---|---|
| 3,012,192 | 12/1961 | Lion | 324/60 R X |
| 3,020,476 | 2/1962 | Jacoby | 324/61 R |
| 3,545,275 | 12/1970 | Harrison et al. | 324/61 R X |
| 3,688,190 | 8/1972 | Blum | 324/61 R |
| 3,688,206 | 8/1972 | Eide | 324/60 R X |
| 3,723,866 | 3/1973 | Michaud et al. | 324/61 R |
| 3,775,687 | 11/1973 | Machlanski | 324/60 C |
| 3,783,374 | 1/1974 | Eide et al. | 324/60 C |
| 4,006,411 | 2/1977 | Akagawa et al. | 324/61 R |
| 4,054,833 | 10/1977 | Briefer | 324/60 C |
| 4,093,915 | 6/1978 | Briefer | 324/60 R |

FOREIGN PATENT DOCUMENTS 1196033 6/1970 United Kingdom .............. 324/61 R

*Primary Examiner*—Stanley T. Krawczewicz
*Attorney, Agent, or Firm*—Kenway & Jenney

[57] ABSTRACT

A capacitive sensor system including a sensor with two fixed plate elements having opposed planar, electrically conductive surfaces serving as electrodes. The sensor further includes a movable, electrically conductive diaphragm positioned between the electrodes. At least one diode detector network is coupled across the electrodes. The diode detector networks each include a pair of oppositely directed series connected diodes with the junction between the diodes of each network being coupled to the diaphragm. In embodiments having only one diode detector network, the junction between the two diodes may be directly or capacitively coupled to the diaphragm. In embodiments having two such diode detector networks, the diodes of the second network are oppositely directed with respect to the corresponding diodes in the first network, and the junction between the diodes in the second network are capacitively coupled to the diaphragm while the junction between the diodes in the first diode network may be either directly or capacitively coupled to the diaphragm. The system further includes a coupler for coupling a constant amplitude a.c. signal across the electrodes of the sensor. The net d.c. voltage across the diodes of the diode detector networks is representative of the position of the diaphragm between the two sensor electrodes.

29 Claims, 15 Drawing Figures

LINEAR CAPACITIVE SENSOR SYSTEM

REFERENCE TO RELATED PATENT APPLICATION

This application is related to U.S. patent application Ser. No. 200,788, entitled Capacitive Pressure Sensor and filed on Oct. 27, 1980. That application is incorporated by reference herein.

BACKGROUND OF THE DISCLOSURE

This invention relates to measurement systems, and more particularly, to measurement systems having a capacitive sensor.

Capacitive sensors have often been used to provide the input signal for many forms of prior art transducer instrumentation, for example, scales or balances, accelerometers, and pressure transducers, or proximity gauges. In such systems, the precision at which measurements can be made is very much a function of the stability of the circuit interfacing the sensor portion and the read-out portion of the system. In general, the prior art systems have permitted relatively low precision measurements due to sensitivity of the interface circuit to combinations of various factors, such as drive signal wave shape and drive signal amplitude.

In practice, these shortcomings of the prior art systems have been in part overcome by systems, such as those disclosed in U.S. Pat. No. 4,093,915, where a feedback network is used for linearizing the nominal system output. While such systems are generally effective, in many applications, the feedback networks add substantially to the circuit complexity, and are correspondingly expensive.

Accordingly, it is an object of the present invention to provide a system for generating a signal linearly related to the capacitor reactance of a sensor capacitor.

Another object is to provide a system for determining the capacitance associated with a sensor capacitor with the system being substantially independent of the wave shape of the driving signal.

SUMMARY OF THE INVENTION

Briefly, the invention includes a capacitive sensor with two fixed plate elements having opposed planar, electrically conductive surfaces serving as electrodes. The opposed surfaces are substantially parallel and spaced apart by a predetermined distance. The sensor further includes an electrically conductive diaphragm having a substantially planar portion positioned between and parallel to the electrodes. The portion of the diaphragm between the electrodes is movable in the direction perpendicular to the plane of the electrodes.

At least one diode detector network is coupled across the electrodes. The diode detector networks each include a pair of oppositely directed series connected diodes with the junction between the diodes of each network being coupled to the diaphragm. In embodiments having only one diode detector network, the junction between the two diodes may be directly or capacitively coupled to the diaphragm. In embodiments having two such diode detector networks, the diodes of the second network are oppositely directed with respect to the corresponding diodes in the first network, and the junction between the diodes in the second network are capacitively coupled to the diaphragm while the junction between the diodes in the first diode network may be either directly or capacitively coupled to the diaphragm.

The system further includes a coupler for coupling a constant amplitude a.c. signal across the electrodes of the sensor. An output network may provide an output signal representative of the net d.c. voltage across the diodes of the diode detector networks.

With this configuration, an a.c. signal may be applied across the fixed electrodes of the sensor. Since the diaphragm is substantially parallel to the fixed electrodes, that diaphragm lies on an equipotential plane within the sensor, and therefore, is characterized by the voltage at that equipotential plane. Since the equipotential planes increase in voltage from zero volts a.c. at one electrode up to a peak amplitude a.c. voltage at the other electrode, the amplitude of the signal at the diaphragm is a linear function of the position of the diaphragm with respect to the sensor electrodes.

The detector networks convert the a.c. signals to a linear, ground referenced d.c. output signal. Particularly, in an embodiment with one diode detector network, the a.c. across the portion of the detector between the diaphragm and one of the electrodes is clamped by the detector diode connected across those elements, such that the average voltage at the junction of the two diodes is offset by a d.c. voltage corresponding to the peak amplitude of the a.c. voltage at that one of the electrodes.

Similarly, the second diode of the detector provides an oppositely directed d.c. offset to the voltage at the other electrode. This second offset correspond to the average value of the peak signal between the diaphragm and the other electrode. When the diaphragm is exactly centrally located between the two electrodes, a net voltage d.c. voltage of zero is across the two diodes of the detector network. When the diaphragm is offset from center, since the two diodes are oppositely directed, the d.c. voltage offsets are in the opposite sense so that the resultant net d.c. voltage across both detector diodes corresponds to the unbalance between the sensor halves (established by the movement of the diaphragm with respect to the electrodes).

This net d.c. voltage across the two diodes of the detector is a linear function of the position of the diaphragm between the electrodes. This form of the invention is particularly effective for symmetric a.c. drive signals and provides a low component count (and correspondingly inexpensive) system.

In embodiments having two diode detector networks, a first diode detector operates in the manner similar to the diode detector described above. The second detector network is directly coupled to one end of the first network and capacitively coupled to the other end of that network and provides a similar type operation but where the diodes are oppositely directed. Consequently, this two diode detector system also provides an output representative of the net d.c. voltage across the diodes of both detectors. However, in this case, the opposite sensing of the second detector exactly offsets errors due to drive waveform asymmetry.

BRIEF DESCRIPTION OF THE DRAWING

The invention disclosed herein will be better understood with reference to the drawings, in which.

DESCRIPTION OF THE PREFERRED EMBODIMENT

Figure 1:
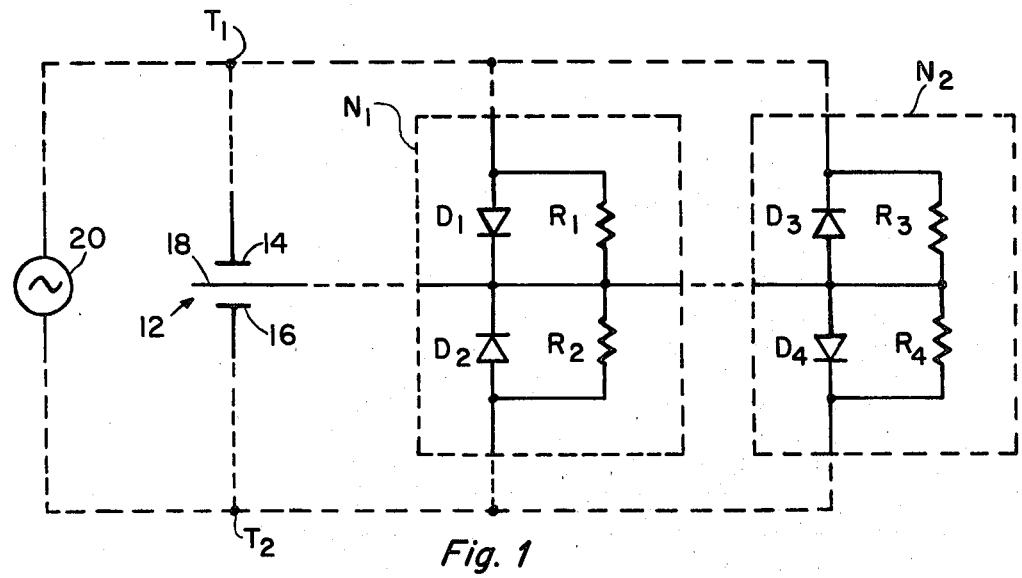
FIG. 1 shows in generalized schematic form, an embodiment of the present invention.

FIG. 1 shows in a generalized schematic form, an embodiment of the present invention, where the dotted lines represent electrical couplings. The illustrated system 10 includes a capacitive sensor 12 having a pair of fixed plate elements, or electrodes, 14 and 16. Electrodes 14 and 16 have opposed planar, electrically conductive surfaces that are substantially parallel and spaced apart by a predetermined distance. The sensor 12 also includes a substantially planar conductive diaphragm 18 which is positioned between electrodes 14 and 16. The diaphragm 18 is movable in the direction perpendicular to the plane of the opposed surfaces of electrodes 14 and 16. By way of example, diaphgram 18 may be an edge supported diaphragm of the form disclosed in the incorporated reference, having its edges supported with respect to the two fixed electrodes 14 and 16. With this configuration, a central portion of diaphragm 18 between electrodes 14 and 16 may be substantially planar and parallel to those electrodes (although minor deviations from this are possible due to pressure differentials across the diaphragm 18, or alternatively, acceleration induced motion of the diaphragm 18).

In FIG. 1, the electrode 14 is coupled to terminal $T_1$ and electrode 16 is coupled to terminal $T_2$. In various embodiments, this coupling may have the form of either direct or capacitive coupling, as noted more particularly below.

The system of FIG. 1 also includes two detector networks outlined by dashed lines and identified by reference designations $N_1$ and $N_2$, respectively. Both of networks $N_1$ and $N_2$ include two series connected, oppositely directed diodes and associated parallel resistors ($D_1$ and $D_2$ and $R_1$ and $R_2$, respectively, for network $N_1$, and $D_3$ and $D_4$ and $R_1$ and $R_2$, respectively, for network $N_2$). The diodes in network $N_2$ are oppositely directed with respect to their counterparts in network $N_1$. Both networks are coupled to terminals $T_1$ and $T_2$. In both networks, the junction point between the two diodes is coupled to the diaphragm 18, although for $N_2$ that coupling is by way of the junction of $N_1$. The coupling to the diaphragm 18 may be direct or capacitive, as described more fully below. A signal generator 20 is provided which couples (directly or capacitively, in various embodiments) a constant amplitude a.c. signal across terminals $T_1$ and $T_2$.

It should be noted at this point that the directions of all of the diodes in networks $N_1$ and $N_2$ may be reversed without affecting the functioning of the system.

With this configuration, a constant amplitude a.c. signal is applied across the terminals $T_1$ and $T_2$. The net d.c. voltage across the diodes of networks $N_1$ and $N_2$ is representative of the position of the diaphragm 18 with respect to the electrodes 14 and 16.

FIGS. 2–11 schematically illustrate ten particular configurations of the general system shown in FIG. 1. These systems will now be explained in detail.

Generally, FIGS. 2–7 show single diode detector network embodiments, while FIGS. 8–11 show two diode detector network embodiments. In these figures, elements having corresponding elements in the embodiment of FIG. 1 are identified by the same reference designations.

Figure 2:
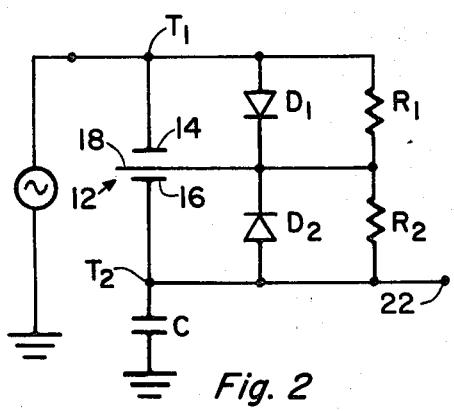
FIGS. 2–7 and 14 show in schematic form, exemplary embodiments having a single diode detector network.

FIG. 2 shows an embodiment adapted for coupling to a signal generator 20 which provides a ground referenced, constant amplitude a.c. signal to terminal $T_1$. A diode detector network including diodes $D_1$ and $D_2$ and resistors $R_1$ and $R_2$ is directly connected between terminals $T_1$ and $T_2$. The terminal $T_2$ is coupled to ground by way of a by-pass capacitor C. In operation, the diaphragm 18 may be responsive to a pressure differential, or acceleration, to move between the electrodes 14 and 16 of the sensor 12. Thus, the diaphragm 18 lies on an equi-potential plane and therefore carries the a.c. potential at that level. The a.c. signal across electrode 14 and diaphragm 18 has its base line shifted by diode $D_1$ so that there is an average d.c. potential equal to the peak value of the a.c. potential produced across diode $D_1$. The a.c. across diaphragm 18 and electrode 16 is similarly rectified. Imbalances in a.c. on the sensor 12 (that is, due to offsetting of the diaphragm 18 from the center) provides a corresponding d.c. unbalance at the output terminal 22. Thus the net d.c. voltage at terminal 22 is a linear function of the position of diaphragm 18.

Figure 3:
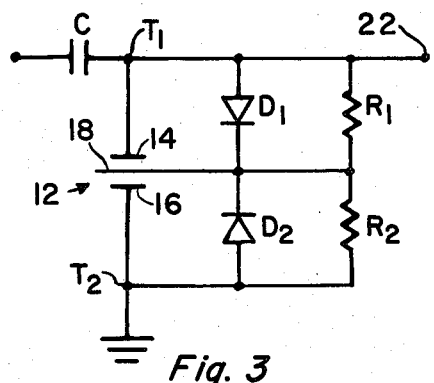

FIG. 3 shows a similar embodiment, but where the a.c. signal from generator 20 is capacitively coupled to $T_1$ by a coupling capacitor C. In this configuration, terminal $T_2$ is maintained at the ground reference potential. The diode $D_1$ is directly coupled to terminal $T_1$ and the diode $D_2$ is directly coupled to terminal $T_2$. In operation, the a.c. signal across diaphragm 18 and terminal $T_2$ is clamped by diode $D_2$ so that the average voltage at the cathode of $D_2$ must be positive and vary proportionally with the amplitude of the a.c. signal. A similar clamping occurs at the diode $D_1$, but since $D_1$ is reversed with respect to $D_2$, the resultant d.c. voltage is reversed. Therefore, the net d.c. voltage at $D_1$ (at terminal 22) across the diodes $D_1$ and $D_2$ represents the unbalance of the sensor 12.

Figure 4:
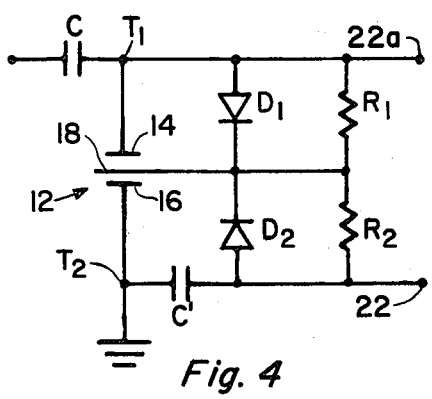

The embodiment of FIG. 4 is substantially similar to that of FIG. 3, except that the diode $D_2$ is capacitively coupled to the ground reference potential by way of capacitor C' and the output terminal 22 is connected to diode $D_2$. This embodiment provides input-output isolation, where the output signal is the net d.c. across terminals 22 and 22a.

Figure 5:
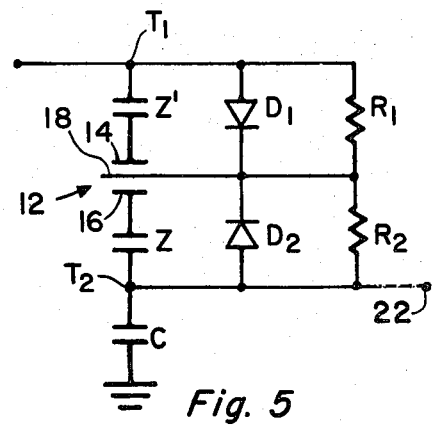
Figure 6:
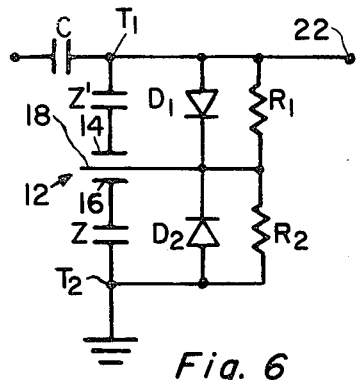
Figure 7:
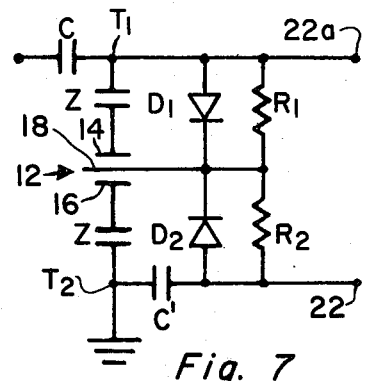

The embodiments of FIGS. 5–7 are substantially similar to the respective ones of FIGS. 2–4, except that the plate elements 14 and 16 of sensor capacitor 12 are capacitively coupled from terminals T1 and T2 by capacitors denoted by Z and Z', respectively, in those figures.

Figure 8:
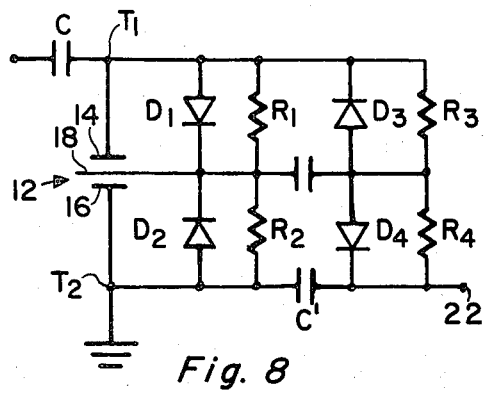
FIGS. 8–13 and 15 show in schematic form, exemplary embodiments having the diode detector networks.
Figure 9:
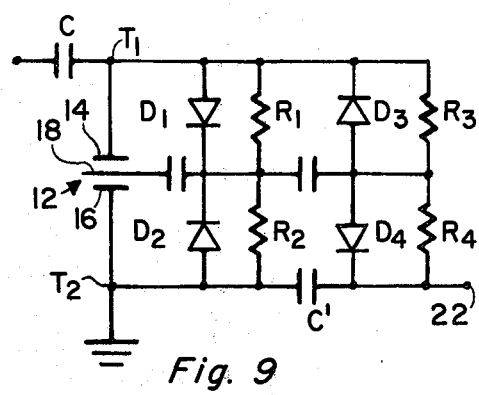
Figure 10:
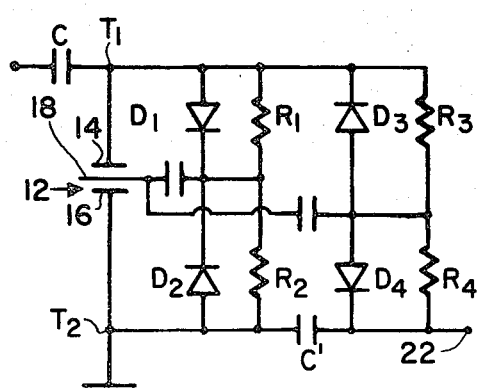

FIGS. 8–10 show two diode detector network embodiments which are similar to the embodiments of FIG. 3, but which include a second diode detector having diode D3 and resistor R3 directly coupled to terminal T1 and diode D4 and resistor R4 capacitively coupled to terminal T2 by capacitor C'. Terminal T2 is directly coupled to the ground reference potential. In FIG. 8 the junction between diodes D3 and D4 is directly coupled to the diaphragm 18, while in FIGS. 9–11 that junction is capacitively coupled to diaphragm 18. In all of FIGS. 8–11, the junction between the diodes of the second network is capacitively coupled to diaphragm 18. The diode D4 of the second detector network is capacitively coupled to the ground reference potential of terminal T2 by way of by-pass capacitor C'.

In operation of the circuits of FIG. 8, a signal generator 20 (not shown in that Figure) provides an a.c. voltage at terminal T1. As in FIG. 3, the d.c. portion of the voltage at terminal T1 is representative of the d.c. drops across diodes D1 and D2. The diodes $D_3$ and $D_4$ of the second network operate in substantially similar to the diodes $D_1$ and $D_2$ of the first network, and provide oppositely directed drops across those diodes so that the net d.c. voltage across diodes D1, D2, D3 and D4 at terminal 22 is representative of the position of diaphragm 18 between electrodes 14 and 16.

The circuits of FIGS. 9-10 operate in a similar manner to the embodiment of FIG. 8, where the a.c. signal is capacitively coupled to terminal T1. Again, diodes D3 and D4 act similarly, but in an opposite direction from those in detector D1 and D2 and provide a net diode drop at terminal 22 which is representative of the position of diaphragm 18.

Figure 11:
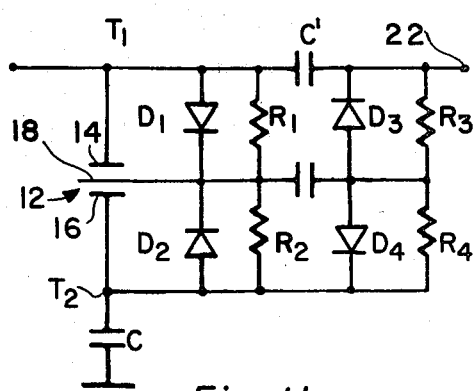

FIG. 11 shows a two diode detector network which is similar to the embodiment of FIG. 2, but which includes a second diode detector network having diode $D_3$ and resistor $R_3$ capacitively coupled to terminal $T_1$ and diode $D_4$ and resistor directly coupled to terminal $T_2$. The junction of diodes $D_3$ and $D_4$ is capacitively coupled to diaphragm 18. The output terminal 22 is coupled directly to diode $D_3$, and provides an output signal corresponding to the net d.c. voltage across diodes $D_1$, $D_2$, $D_3$ and $D_4$.

Figure 12:
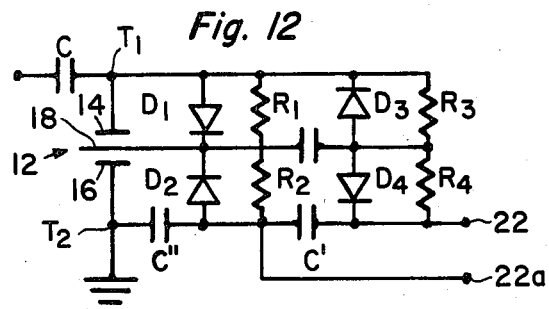
Figure 13:
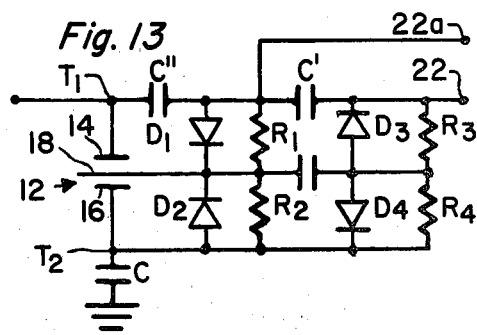

FIGS. 12 and 13 show two diode detector embodiments which are similar to the embodiments of FIGS. 8 and 11, respectively, but which include a capacitor C" between diode $D_2$ and terminal $T_2$ (in FIG. 12) and between diode $D_1$ and terminal $T_1$ (in FIG. 13). These embodiments provide input-output isolation, with the output being the d.c. portion of the potential difference between terminals 22 and 22a.

For a given diaphragm position, the systems of FIGS. 8-13 provide substantially twice the output net d.c. voltage compared to similar systems of FIGS. 2 and 3. In addition, the systems of FIGS. 8-13 are substantially immune to error due to driving waveform asymmetry. Any of the systems of FIGS. 8-13 may also include capacitors Z and Z' in a manner similar to the embodiments of FIGS. 5-7.

Figure 14:
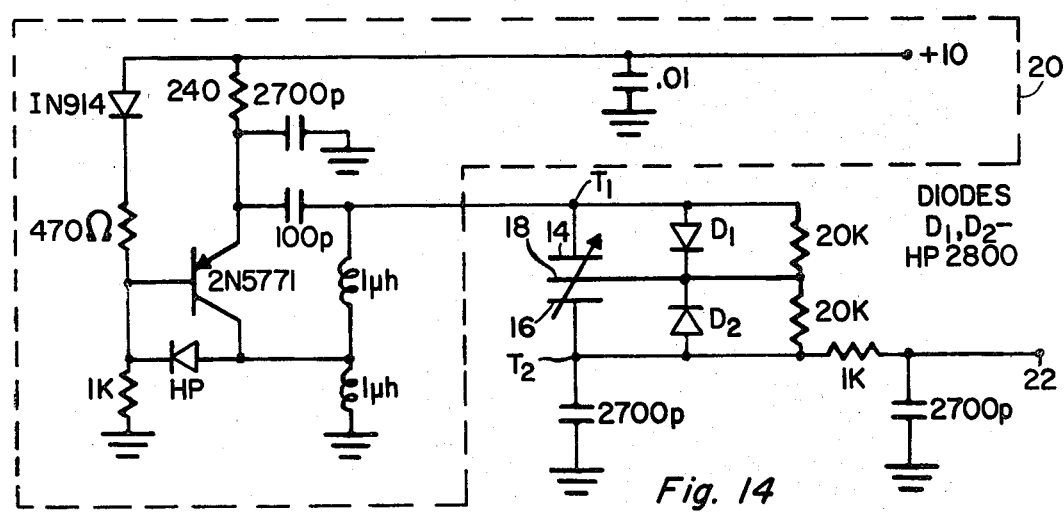
Figure 15:
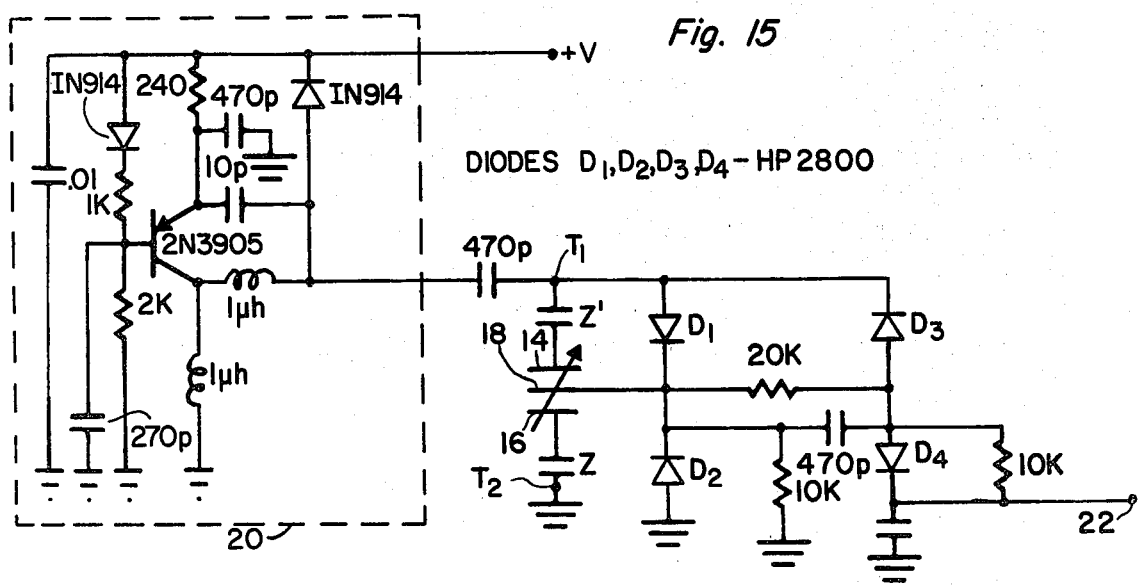

By way of example, FIGS. 14 and 15 show schematic diagrams corresponding to the embodiments depicted in FIGS. 2 and 9, respectively. In those figures, the oscillators corresponding to signal generator 20 provide peak-to-peak signals which have twice the peak-to-peak value of the supply voltage with a minimum number of component parts. The series inductors in the output of the oscillator de-couple the collector of the transistor driver from the resonant circuitry, purifying the waveform at the sensor and doubling the a.c. voltage there. In the oscillator of FIG. 12, the collector-to-base diode at the oscillator transistor stabilizes the level of oscillation.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

I claim:

1. A capacitive sensor system comprising:

A. a capacitive sensor including first and second plate elements and means for coupling said first and second plate elements to first and second terminals, respectively, said plate elements having opposed, electrically conductive surfaces, said opposed surfaces being substantially parallel and spaced apart by a predetermined fixed distance, and including an electrically conductive diaphragm member positioned substantially parallel to and between said opposed surfaces, said diaphragm member being movable in the direction perpendicular to the plane of said opposed surfaces, B. at least one diode detector network coupled across said first and second terminals, each of said diode detector networks including a pair of oppositely directed series connected diodes and means for coupling said series connected pair of diodes across said first and second terminals, and means for resistively shunting each of said diodes in said diode networks, and further including means for noninductively coupling the junction between said diodes to said diaphragm member, and C. means for coupling a substantially constant amplitude a.c. signal across said first and second terminals, whereby the net d.c. voltage across the diodes of said diode detector networks is representative of the position of said diaphragm with respect to said plate elements.

2. A system according to claim 1 wherein said second terminal is capacitively coupled to a ground reference potential, and wherein said diode coupling means for one of said diode detector networks includes means for directly connecting said network across said first and second terminals, and wherein said a.c. signal coupling means includes means for coupling a ground-referenced a.c. signal with a zero volt average value to said first terminal, whereby the d.c. portion of the voltage at said second terminal corresponds to said net d.c. voltage.

3. A system according to claim 2 wherein said plate element coupling means directly couples said plate elements to the respective one of said first and second terminals.

4. A system according to claim 2 wherein said plate element coupling means capacitively couples said plate elements to the respective ones of said first and second terminals.

5. A system according to claim 1 wherein said second terminal is directly coupled to a ground reference potential, and wherein said diode coupling means for a first of said diode detector networks includes means for directly connecting said first network across said first and second terminals, and wherein said a.c. signal coupling means includes means for capacitive coupling said a.c. signal to said first terminal, whereby the d.c. portion of the voltage at said first terminal corresponds to said net d.c. voltage.

6. A system according to claim 5 wherein said plate element coupling means directly couples said plate elements to the respective one of said first and second terminals.

7. A system according to claim 5 wherein said plate element coupling means capacitively couples said plate elements to the respective ones of said first and second terminals.

8. A system according to claim 1 wherein said second terminal is directly coupled to a ground reference potential, and
wherein said diode coupling means for a first of said diode detector networks includes means for directly connecting said first network to said first terminal and for capacitively coupling said first network to said second terminal, and
wherein said a.c. signal coupling means includes means for capacitively coupling said a.c. signal to said first terminal,
whereby the d.c. portion of the potential difference between said first terminal and the diode coupled to said second terminal corresponds to said net d.c. voltage.

9. A system according to claim 8 wherein said plate element coupling means directly couples said plate elements to the respective one of said first and second terminals.

10. A system according to claim 8 wherein said plate element coupling means capacitively couples said plate elements to the respective ones of said first and second terminals.

11. A system according to claims 3 or 4 or 6 or 7 or 9 or 10 wherein the junction between the diodes of the first of said first diode detector network is capacitively coupled to said diaphragm.

12. A system according to claims 3 or 4 or 6 or 7 or 9 or 10 wherein the junction between the diodes of the first of said first diode detector network is directly coupled to said diaphragm.

13. A system according to claim 1 wherein said second terminal is directly coupled to a ground reference potential, and
wherein said diode coupling means for a first of said diode detector networks includes means for directly coupling said first network across said first and second terminals,
wherein said diode coupling means for a second of said diode detector networks includes means for directly coupling said second network to said first terminal and for capacitively coupling said second network to said second terminal,
wherein said a.c. signal coupling means includes means for capacitively coupling said a.c. signal to said first reference terminal,
whereby the d.c. portion of the voltage at the diode of said second network coupled to said second terminal corresponds to said net d.c. voltage.

14. A system according to claim 13 wherein the junction between the diodes of said first network is directly coupled to said diaphragm, and the junction between the diodes of said second network is capacitively coupled to said diaphragm.

15. A system according to claim 13 wherein the junction between the diodes of said first network is capacitively coupled to said diaphragm, and the junction between the diodes of said second network is capacitively coupled to said diaphragm.

16. A system according to claim 1 wherein said second terminal is capacitively coupled to a ground reference potential,
wherein said diode coupling means for a first of said diode detector networks includes means for directly coupling said first network across said first and second terminals, and
wherein said diode coupling means for a second of said diode detector networks includes means for capacitively coupling said second network to said first terminal and for directly coupling said second network to said second terminal, and
wherein said a.c. signal coupling means includes means for capacitively coupling said a.c. signal to said first reference terminal,
whereby the d.c. portion of the voltage at the diode of said second network coupled to said first terminal corresponds to said net d.c. voltage.

17. A system according to claim 16 wherein the junction between the diodes of said first network is directly coupled to said diaphragm, and the junction between the diodes of said second network is capacitively coupled to said diaphragm.

18. A system according to claim 16 wherein the junction between the diodes of said first network is capacitively coupled to said diaphragm, and the junction between the diodes of said second network is capacitively coupled to said diaphragm.

19. A system according to claim 1 wherein said second terminal is directly coupled to a ground reference potential,
wherein said diode coupling means for a first of said diode detector networks includes means for directly coupling said first network to said first terminal and means for capacitively coupling said first network to said second terminal, and
wherein said diode coupling means for a second of said diode detector networks includes means for directly coupling said second network to said first terminal and means for capacitively coupling said second network to said second terminal, and
wherein said a.c. signal coupling means includes means for capacitively coupling said a.c. signal to said first terminal,
whereby the d.c. portion of the potential difference between the diodes coupled to said second terminal corresponds to said net d.c. voltage.

20. A system according to claim 19 wherein said second terminal is directly coupled to a ground reference potential,
wherein said diode coupling means for a first of said diode detector networks includes means for directly coupling said first network to said first terminal and means for capacitively coupling said first network to said second terminal, and
wherein said diode coupling means for a second of said diode detector networks includes means for directly coupling said second network to said first terminal and means for capacitively coupling said second network to said second terminal, and
wherein said a.c. signal coupling means includes means for capacitively coupling said a.c. signal to said first terminal,
whereby the d.c. portion of the potential difference between the diodes coupled to said second terminal corresponds to said net d.c. voltage.

21. A system according to claim 19 wherein said second terminal is capacitively coupled to a ground reference potential,
wherein said diode coupling means for a first of said diode detector networks includes means for capacitively coupling said first network to said first terminal and means for capacitively coupling said first network to said second terminal, and wherein said diode coupling means for a second of said diode detector networks includes means for capacitively coupling said second network to said first terminal and means for directly coupling said second network to said second terminal, and wherein said a.c. signal coupling means includes means for directly coupling said a.c. signal to said first terminal, whereby the d.c. portion of the potential difference between the diodes coupled to said first terminal corresponds to said net d.c. voltage.

22. A system according to claim 1 wherein said second terminal is capacitively coupled to a ground reference potential, wherein said diode coupling means for a first of said diode detector networks includes means for capacitively coupling said first network to said first terminal and means for capacitively coupling said first network to said second terminal, and wherein said diode coupling means for a second of said diode detector networks includes means for capacitively coupling said second network to said first terminal and means for directly coupling said second network to said second terminal, and wherein said a.c. signal coupling means includes means for directly coupling said a.c. signal to said first terminal, whereby the d.c. portion of the potential difference between the diodes coupled to said first terminal corresponds to said net d.c. voltage.

23. A system according to claim 22 wherein said second terminal is directly coupled to a ground reference potential, wherein said diode coupling means for a first of said diode detector networks includes means for directly coupling said first network to said first terminal and means for capacitively coupling said first network to said second terminal, and wherein said diode coupling means for a second of said diode detector networks includes means for directly coupling said second network to said first terminal and means for capacitively coupling said second network to said second terminal, and wherein said a.c. signal coupling means includes means for capacitively coupling said a.c. signal to said first terminal, whereby the d.c. portion of the potential difference between the diodes coupled to said second terminal corresponds to said net d.c. voltage.

24. A system according to claim 22 wherein said second terminal is capacitively coupled to a ground reference potential, wherein said diode coupling means for a first of said diode detector networks includes means for capacitively coupling said first network to said first terminal and means for capacitively coupling said first network to said second terminal, and wherein said diode coupling means for a second of said diode detector networks includes means for capacitively coupling said second network to said first terminal and means for directly coupling said second network to said second terminal, and wherein said a.c. signal coupling means includes means for directly coupling said a.c. signal to said first terminal, whereby the d.c. portion of the potential difference between the diodes coupled to said first terminal corresponds to said net d.c. voltage.

25. A displacement sensor system, comprising a capacitive sensor including a pair of fixed elements with spaced parallel electrically conductive surfaces aligned along an axis substantially normal to said surfaces defining therebetween a continuum of parallel equipotential surfaces and a movable element mounted for axial displacement midway between said fixed elements having an electrically conductive surface substantially parallel to the surface of said fixed elements, a first capacitor half being formed by said movable element and one of said fixed elements and a second capacitor half being formed by said movable element and the other one of said fixed elements, means for applying a nonrectified a.c. signal across said capacitive sensor such that nonrectified a.c. signals appear across both said capacitor halves, detector means for shifting the baseline of that portion of the a.c. signal developed across one capacitor half in accordance with its amplitude, and for shifting the base line of and inverting that portion of the a.c. signal developed across the other capacitor half in accordance with its amplitude, and output means coupled to said detector means for combining the opposed baseline shifted a.c. signals to produce a d.c. output signal representing the differential amplitudes of the a.c. signals across said capacitor halves caused by displacement of said movable element.

26. The system of claim 25, wherein said detector means includes a pair of oppositely directed, series connected diodes, the junction between corresponding ends of said diodes being electrically coupled to said movable element, the other ends of said diodes being electrically coupled to said fixed elements respectively.

27. The system of claim 26, wherein said output means includes means for reproducing net d.c. voltage across said diodes.

28. The system of claim 27, wherein said detector means further includes another pair of oppositely directed series connected diodes having reversed polarity relative to said one pair of diodes, the junction between corresponding ends of said diodes in said other pair being electrically coupled to the junction between said diodes in said one pair, the other ends of said diodes in said other pair being electrically coupled to the other ends of said diodes in said one pair.

29. The system of claim 28, wherein said output means further includes means for reproducing the net d.c. voltage across said diode pairs.

* * * * *